(12) United States Patent
Shang et al.

(10) Patent No.: US 10,345,716 B2
(45) Date of Patent: Jul. 9, 2019

(54) METROLOGY METHOD IN RETICLE TRANSPORTATION

(71) Applicant: Taiwan Semiconductor Manufacturing Co., Ltd., Hsinchu (TW)

(72) Inventors: Yao-Yuan Shang, Taichung (TW); Kuo-Shu Tseng, New Taipei (TW); Yen-Yu Chen, Taichung (TW); Chun-Chih Lin, Taipei (TW); Yi-Ming Dai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/877,646

(22) Filed: Jan. 23, 2018

(65) Prior Publication Data

US 2019/0163070 A1    May 30, 2019

Related U.S. Application Data

(60) Provisional application No. 62/590,406, filed on Nov. 24, 2017.

(51) Int. Cl.
*G03F 7/20* (2006.01)

(52) U.S. Cl.
CPC ........ *G03F 7/7085* (2013.01); *G03F 7/70508* (2013.01); *G03F 7/70733* (2013.01); *G03F 7/70883* (2013.01)

(58) Field of Classification Search
CPC .... G03F 3/20; G03F 7/70775; G03F 7/70725; G03F 7/7085
USPC ...................................... 355/72–76
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2009/0292374 A1* | 11/2009 | Iwakura | G05B 19/41835 700/79 |
| 2015/0131069 A1* | 5/2015 | Ota | G02B 27/0006 355/67 |
| 2017/0313520 A1* | 11/2017 | Tsai | B65G 17/485 |

* cited by examiner

*Primary Examiner* — Hung Nguyen
(74) *Attorney, Agent, or Firm* — McClure, Qualey & Rodack, LLP

(57) ABSTRACT

A method for fault detection in a fabrication system is provided. The method includes transferring a reticle carrier containing a reticle from an original position to a destination position. The method further includes detecting environmental condition in the reticle carrier during the transfer of the reticle carrier using a metrology tool that is positioned at the reticle carrier. The method also includes issuing a warning when the detected environmental condition is outside a range of acceptable values.

20 Claims, 14 Drawing Sheets

METROLOGY METHOD IN RETICLE TRANSPORTATION

PRIORITY CLAIM AND CROSS-REFERENCE

This application claims the benefit of U.S. Provisional Application No. 62/590,406, filed on Nov. 24, 2017, the entirety of which is incorporated by reference herein

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the 7 nm node). As semiconductor devices are scaled down, new techniques are needed to maintain the electronic components' performance from one generation to the next. Device complexity is increasing as manufacturers design smaller feature sizes and more functionality into integrated circuits. Such complex devices may result in more lithography steps.

As semiconductor technologies evolve, increasingly advanced lithography techniques have been widely adopted for use in today's integrated circuit fabrication processes. Photolithographic techniques involve forming a photoresist layer over a substrate, exposing portions of the photoresist material to a pattern of light in accordance with a desired pattern, developing the photoresist material to remove portions of the photoresist material to expose portions of the underlying material. A suitable etching process such as dry etching, wet etching and the like may then be performed on the substrate. As a result, the exposed underlying material may be removed to produce the desired pattern.

The lithography process of the integrated circuit may comprise multiple steps in the photolithography process. Due to the complexity of the manufacturing process, each lithography step may employ a reticle through which the pattern of a component of an integrated circuit is generated. As a result, there is a need for transporting the reticle in the factory.

Although numerous improvements to the methods of transporting reticles have been invented, they have not been entirely satisfactory in all respects. Consequently, it would be desirable to provide a solution to improve the transportation system so as to mitigate or avoid the production of excess scrap wafer due to improper storage conditions for the reticle during its transportation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
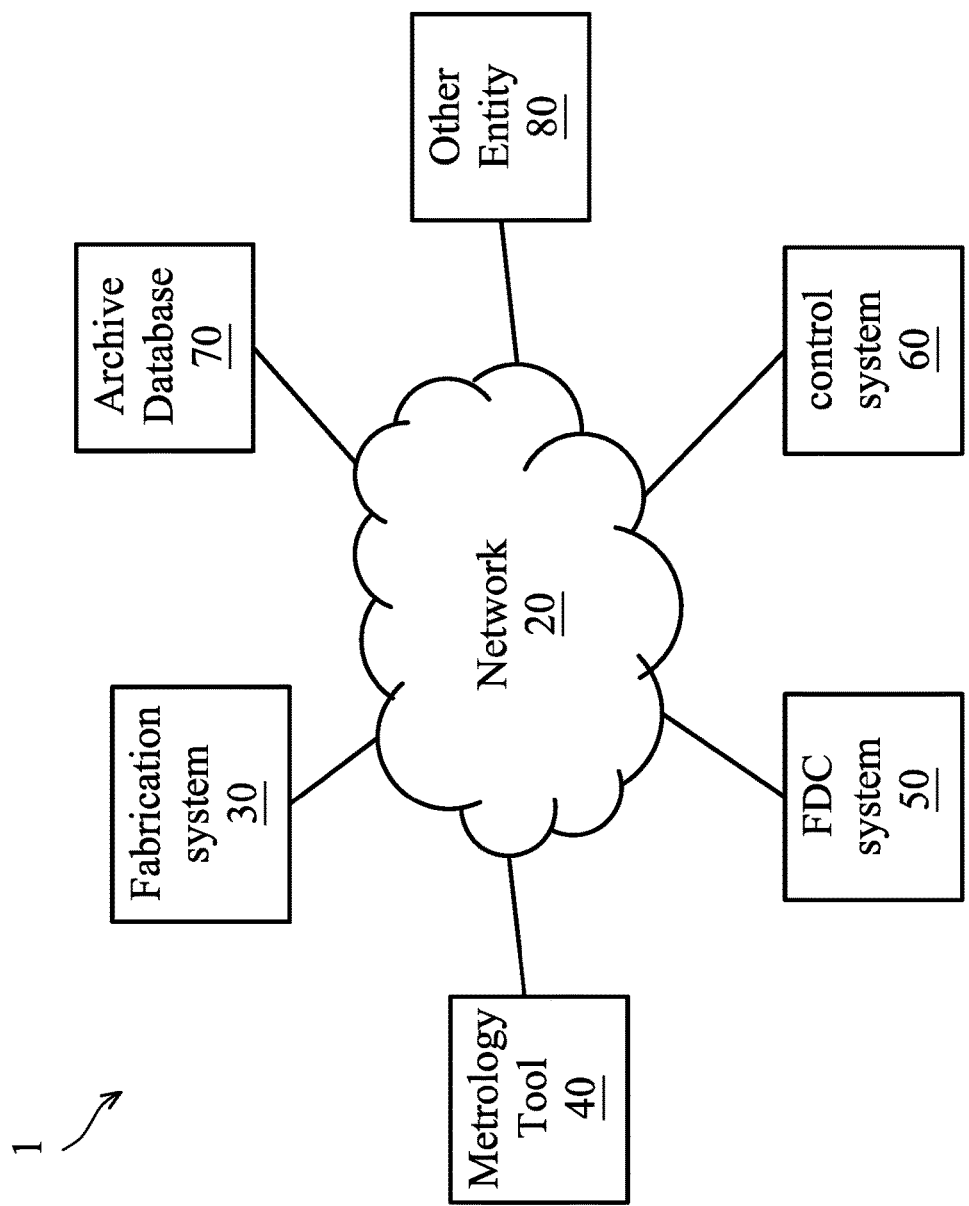
FIG. 1 is a block diagram of a fabrication facility, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (Fin-FETs). For example, the fins may be patterned to produce relatively close spacing between features, for which the above disclosure is well suited. In addition, spacers used in forming fins of FinFETs can be processed according to the above disclosure.

FIG. 1 is a block diagram of a fabrication facility 1 according to various aspects of the present disclosure. The fabrication facility 1 implements integrated circuit manufacturing processes to fabricate integrated circuit devices. For example, the fabrication facility 1 may implement semiconductor manufacturing processes that fabricate semiconductor wafers. It should be noted that, in FIG. 1, the fabrication facility 1 has been simplified for the sake of clarity to better understand the inventive concepts of the present disclosure. Additional features can be added in the fabrication facility 1, and some of the features described below can be replaced or eliminated in other embodiments of the fabrication facility 1. The fabrication facility 1 may include more than one of each of the entities in the depicted embodiment, and may further include other entities not illustrated in the depicted embodiment.

In some embodiments, the fabrication facility 1 includes a network 20 that enables various entities (a fabrication system 30, a metrology tool 40, a fault detection and classification (FDC) system 50, a control system 60, an archive database 70, and another entity 80) to communicate with one another. The network 20 may be a single network or a variety of different networks, such as an intranet, the Internet, another network, or a combination thereof. The network 20 may include wired communication channels, wireless communication channels, or a combination thereof.

Figure 2:
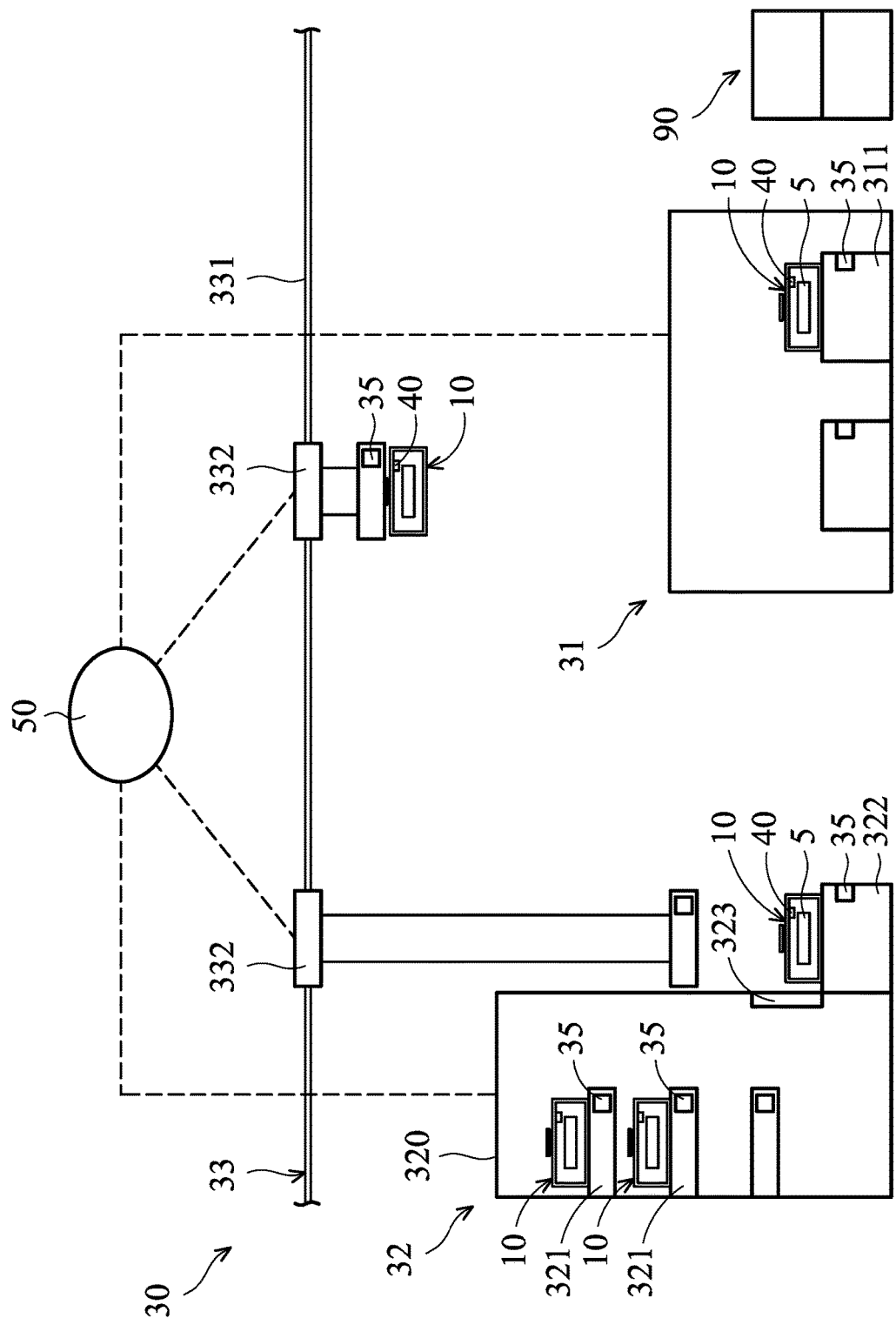
FIG. 2 is a schematic view of partial elements of a fabrication facility, in accordance with some embodiments.

FIG. 2 is a schematic view of partial elements of the fabrication facility 1, in accordance with some embodiments. In some embodiments, the fabrication system 30 includes a lithography exposure apparatus 31, a stocker 32, a transportation apparatus 33 and a number of interface devices 35.

The lithography exposure apparatus 31 is configured to perform a lithography process on wafers (not shown in figures). In some embodiments, the lithography exposure apparatus 31 includes a number of load ports 311. The load ports 311 are configured to load reticle carriers 10 for storing one or more reticles 5. The lithography exposure apparatus 31 may be any kind of lithography apparatuses such as immersion scanners, extreme ultraviolet (EUV) scanners, stepper and/or the like.

The stocker 32 is configured to automation storage and retrieval of the reticle carrier 10. In some embodiments, the stocker 32 includes a main body 320, a number of storage shelves 321 and a load port 322. In some embodiments, the main body 320 is a rectangular enclosure, and one or more openable/closeable and sealable access doors 323 are positioned on a side wall of the main body 320. The storage shelves 321 are positioned inside the main body 320 and configured to facilitate the storage of the reticle carriers 10 within the main body 320. The reticle carrier 10 may be transferred by a robotic arm (not shown in figures), and the transportation or the movement of the reticle carrier 10 in the stocker 32 is controlled by the control system 60.

The load port 322 is configured to support and dock the reticle carriers 10 for facilitating the insertion of reticle carriers 10 into, and their subsequent removal from, the main body 320 of the stocker 32. The load port 322 is positioned along a trail assembly 331 of the transportation apparatus 33 (which is described later) so as to receive the reticle carriers 10 transferred from the vehicle of the transportation apparatus 33. The load ports 322 are positioned in such a way that they correspond to the access door 323 of the main body 320 for transferring reticle carriers 10 into the main body 320.

The transportation apparatus 33 is configured to transport or convey the reticle carrier 10 to or from the stocker 32 or the lithography exposure apparatus 31. The transportation apparatus 33 includes a trail assembly 331 and a number of overhead hoist transport (OHT) assemblies 332, in accordance with some embodiments. The trail assembly 331 is mounted on the ceiling of a FAB, for example. The OHT assembly 332 is suspended by the trail assembly 331, and the transportation or the movement of the OHT assembly 332 on the trail assembly 331 is controlled by the control system 60.

The interface devices 35 are positioned in multiple positions of the fabrication system 30 where the reticle carrier 10 may be placed. For example, each of the load ports 311 of the lithography exposure apparatus 31 has an interface device 35 mounted inside. In addition, each of the load ports 322 and each of the shelves 321 of the stocker 32 has an interface device 35 mounted inside. Moreover, each of the OHT assemblies 332 has an interface device 35 mounted inside. Elements of the interface device 35 will be described in more detail later with reference to FIG. 5.

Figure 3:
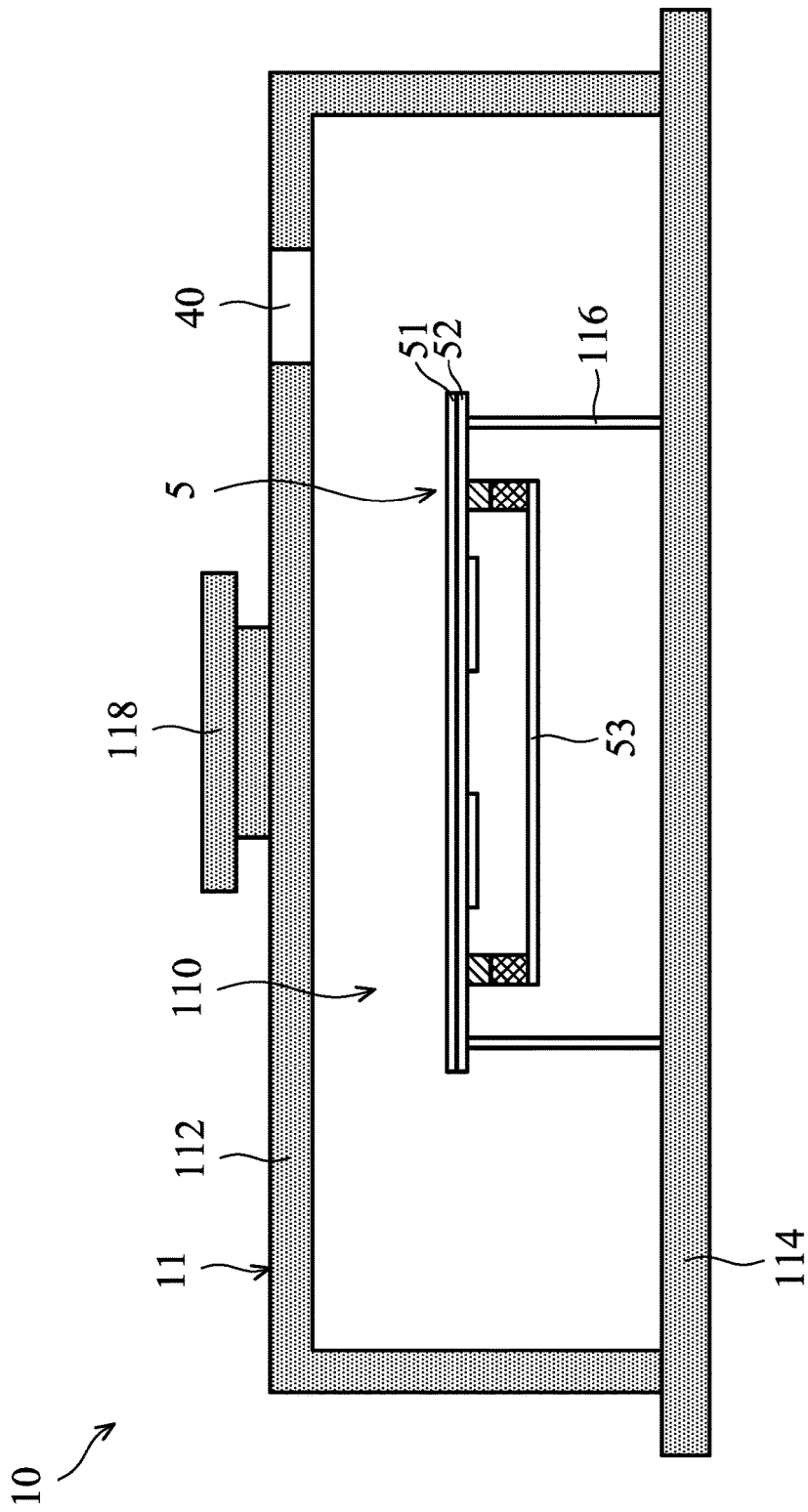
FIG. 3 is a schematic view of a reticle carrier, in accordance with some embodiments.

FIG. 3 shows a schematic view of a reticle carrier 10 with a reticle 5 positioned therein. In the present embodiment, the reticle 5 is a reflective mask. One exemplary structure of the reticle 5 includes a substrate 51 of a suitable material, such as a low thermal expansion material (LTEM) or fused quartz. The reticle 5 further includes a reflective multilayer 52 deposited on the substrate 51. The reflective multilayer 52 includes suitable materials, such as molybdenum-silicon (Mo/Si) film pairs, that are configurable to highly reflect the EUV light. The reticle 5 also includes a pellicle 53. The pellicle 53 is configured to prevent contaminant particles from landing on the substrate 51 and degrading the result of photolithography process (e.g., by keeping contaminant particles away from a plane of focus of the substrate 51).

In some embodiments, the reticle carrier 10 includes an outer pod 11. The outer pod 11 includes a top cover portion 112 and a bottom cover portion 114. The top cover portion 112 and the bottom cover portion 114 define a space 110 that is free or substantially free of foreign particles. In some embodiments, the outer pod 11 further includes a support 116 for fixing the reticle 5 in the space 110. The configuration of the support 116 relative to the reticle 5, especially with regard to pellicle 53, is such that the reticle 5 will not be scratched by the support 116 during transportation. In some embodiments, the outer pod 11 also includes a grip element 118 affixed to the top cover portion 112 so that the OHT assembly 332 can easily carry the outer pod 11 (FIG. 2).

Figure 4:
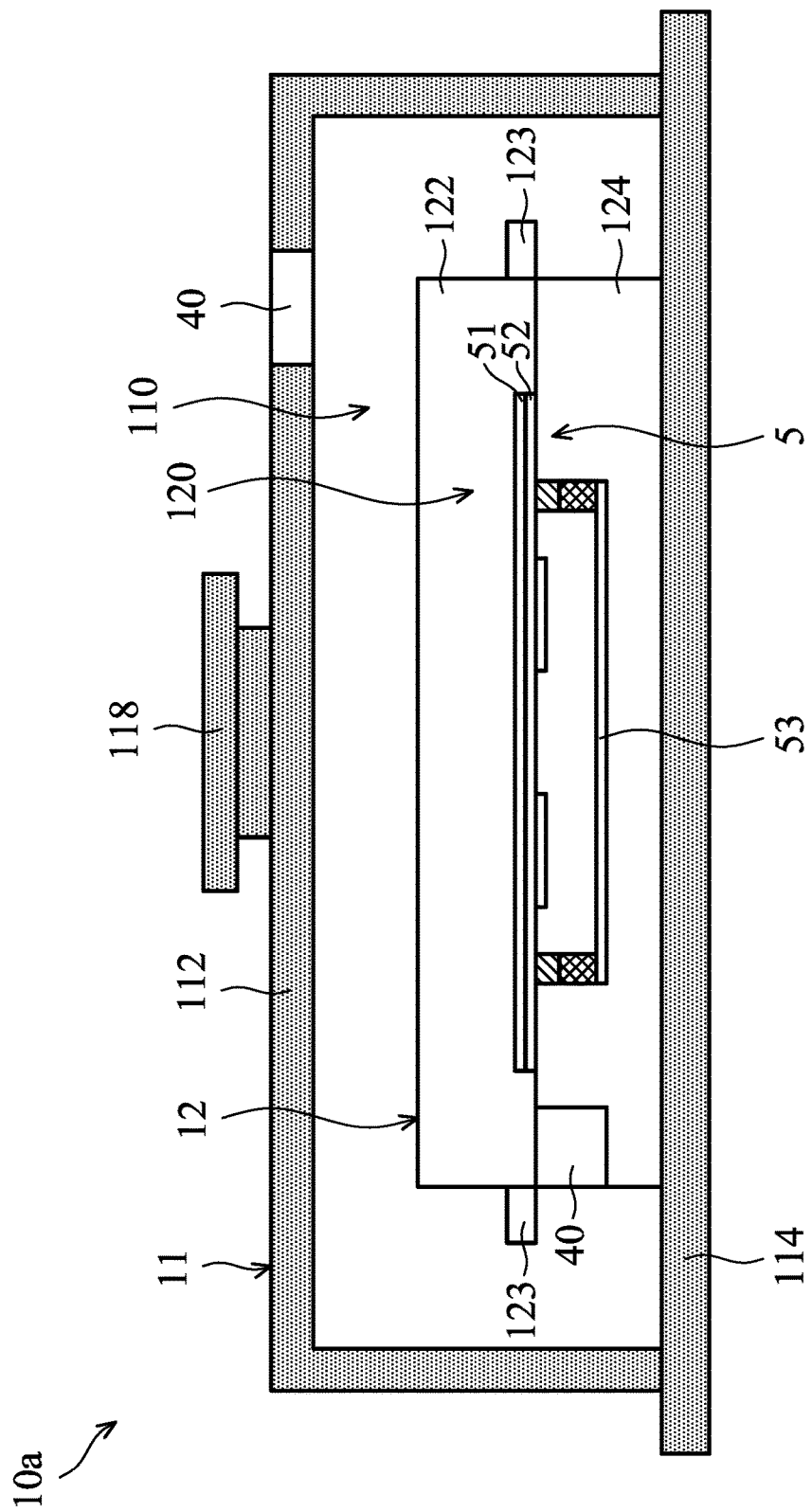
FIG. 4 is a schematic view of a reticle carrier, in accordance with some embodiments.

In some other embodiments, the reticle carrier 10 has a dual pod design and includes various other portions and features. For instance, as shown in FIG. 4, the reticle carrier 10a further includes an inner pod 12. The inner pod 12 is configured so that the outer pod 11 can fit around the inner pod 12. In some embodiments, the inner pod 12 has a cover 122 and a baseplate 124. The cover 122 and the baseplate 124 define a space 120 that is free or substantially free of foreign particles. When the reticle 5 is positioned in the reticle carrier 10a, the inner pod 12 is located in the outer pod 11, and the reticle 5 is located in the inner pod 12. As a result, further protection for the reticle 5 is provided. In some embodiments, the cover 122 has a pair of flanges 123 formed on two opposite side walls. The functions of the flanges 123 will be described in more detail later with reference to FIG. 12.

The one or more metrology tools 40 are positioned in the reticle carrier and are configured to detect one or more environmental conditions in the reticle carrier 10 or 10a. Examples of the detected environmental conditions include temperature, humidity, gas concentration, gas pressure, and static electricity.

For example, as shown in FIG. 3, one metrology tool 40 is configured to detect one or more environmental conditions in the reticle carrier 10. The metrology tool 40 is positioned on the top cover portion 112 of the outer pod 11 and is configured to detect environmental conditions in the space 110 of the outer pod 11.

In another example, as shown in FIG. 4, two metrology tools 40 are configured to detect one or more environmental conditions in the reticle carrier 10a. One metrology tool 40 is positioned on the top cover portion 112 of the outer pod 11 and is configured to detect environmental conditions in the space 110 of the outer pod 11. The other metrology tool 40 is positioned on the baseplate 124 of the inner pod 12 and is configured to detect environmental conditions in the space 120 of the inner pod 12.

Figure 5:
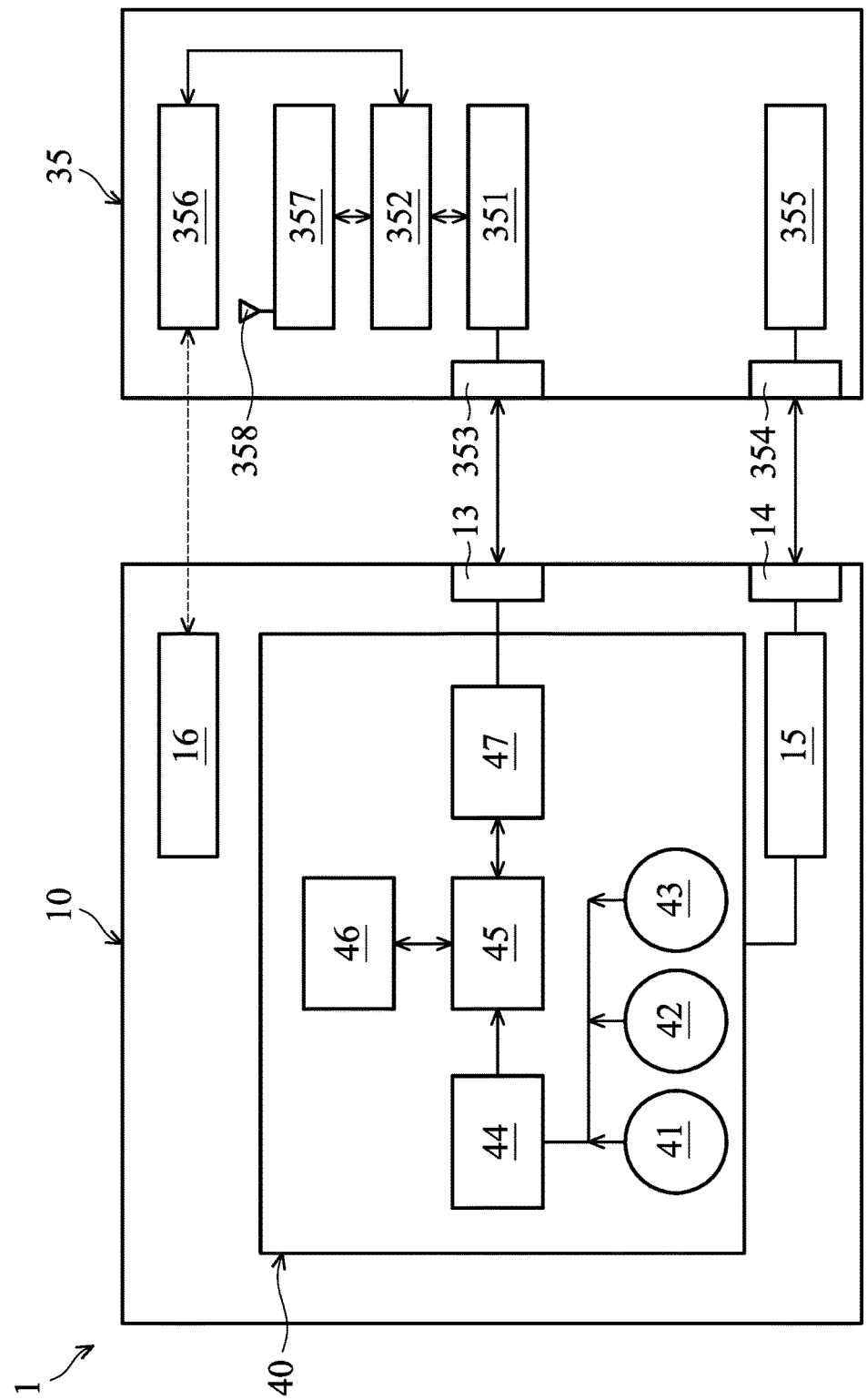
FIG. 5 is a block diagram of partial elements of a fabrication facility, in accordance with some embodiments.

FIG. 5 shows a block diagram of partial elements of the fabrication facility 1, in accordance with some embodiments. While the embodiments of FIG. 5 use the reticle carrier 10 as an example, the reticle carrier 10a can be configured to have a configuration that is the same or similar.

In some embodiments, each of the metrology tools 40 includes one or more sensors, such as sensors 41, 42 and 43. Each of the sensors 41, 42 and 43 is configured to detect one of the environmental conditions in the reticle carrier 10. The multiple sensors 41, 42 and 43 allow different types of data associated with environmental conditions to be collected simultaneously. Alternatively, each of the sensors 41, 42 and 43 is configured to detect more than one of the environmental conditions in the reticle carrier 10.

In some embodiments, each of the metrology tools 40 also includes a signal converter 44, a processor 45, a storage device 46 and an input and output (I/O) controller 47. The signal converter 44 receives the output of the sensors 41, 42 and 43 as input. The signal converter 44 includes a multi-channel analog-to-digital converter in the present embodiment, and each channel is capable of converting the analog signal output from one of the sensors 41, 42 and 43 into digital form. In alternative embodiments where the sensors 41, 42 and 43 output digital signals, the signal converter 44 may perform the necessary data processing on the digital signal outputs of the sensors 41, 42 and 43.

The signal converter 44 then outputs the data associated with environmental conditions to an input of the processor 45, which performs further processing on the data. In an embodiment, the processor 45 controls the operations of the signal converter 44 and the I/O controller 47. In yet another embodiment, the signal converter 44 is integrated into the processor 45.

The processor 45 can communicate with the storage device 46. For example, data associated with environmental conditions can be transferred between the storage device 46 and the processor 45 to enhance the functionality of the processor 45. The storage device 46 may be any form of memory, including Flash, Memory Stick, Micro-SD, or a hard disk. In yet another alternative embodiment, the storage device 46 may be integrated into the processor 45.

The I/O controller 47 is operatively coupled to the processor 45. The I/O controller 47 may be integrated with the processor 45 or it may be a separate component as shown. The I/O controller 47 is generally configured to control interactions with one or more interface devices 35 that can be coupled to the reticle carrier 10. The I/O controller 47 generally operates by exchanging data between the metrology tool 40 and the interface devices 35 that desire to communicate with the metrology tool 40. In some cases, the interface devices 35 may be connected to the I/O controller 47 through wired connections and in other cases the interface devices 35 may be connected to the I/O controller 47 through wireless connections, such as WIFI, 3G, 4G, LTE, 5G, or bluetooth.

In the illustrated embodiment, the interface device 35 is capable of being connected to the I/O controller 47 through a wired connection. In this case, the reticle carrier 10 includes a data connector 13 coupled to the I/O controller 47. The data connector 13 is capable of connecting to a corresponding a data connector 353 and a transceiver 351 located within the interface device 35, and the data connector 13 is configured to engage the data connector 353 so as to provide data transmissions to and from the metrology tool 40.

The reticle carrier 10 also includes a power connector 14. The power connector 14 of the reticle carrier 10 is operatively coupled to a battery 15 of the reticle carrier 10. The power connector 14 is configured to engage a power connector 354 and a power supply circuit 355 of the interface device 35 so as to provide charging power to the battery 15. The battery 15 is then provide operational power to the metrology tool 40. The data connectors 13/353 and the power connectors 14/354 may vary widely. For example, they may be configured to provide one or more data (or power) transmitting functions including USB, USB 2.0, Ethernet, and the like.

In some embodiments, the interface device 35 further includes a processor 352, a transceiver 357, and a code reader 356. In addition, the reticle carrier 10 further includes a carrier identification 16, such as a RFID tag. The carrier identification 16 wirelessly transmits signals with various information on the reticle carrier 10 to the code reader 356, including, but not limited to, the identity of the reticle 5 contained in the reticle carrier 10.

The code reader 356 then outputs the data of the reticle carrier 10 to an input of the processor 352. The processor 352 performs further processing on the data from the code reader 356 and the transceiver 351 and outputs the processed data to the transceiver 357 for data transmission to the FDC system 50 or the control system 60 via an antenna 358 (FIG. 1). For example, the processor 352 matches the carrier identity from the carrier identification 16 with the metrology data from the metrology tool 40, so that the FDC system 50 can reorganize the metrology data is sent from which reticle carrier 10. Therefore, the information of the reticle carrier 10 including the environmental conditions within the reticle carrier 10 can be processed by the FDC system 50 or the control system 60.

Back to FIG. 1 again, the FDC system 50 evaluates conditions in the reticle carrier 10 to detect abnormalities or faults, such as humidity change in the reticle carrier 10, by monitoring the data associated the environmental conditions in the reticle carrier 10 before, during, and after the transportation process. In one example, an abnormality is indicated when the humidity of the reticle carrier 10 varies (higher or lower) significantly from the expected humidity determined, for example, by archival data stored in the archive database 70. Such abnormalities may indicate that there is a fault with the reticle carrier 10. For example, damage to the reticle carrier 10 may cause the humidity of the reticle carrier 10 to vary from the expected humidity.

In some embodiments, the FDC system 50 implements statistical process control (SPC) to track and analyze the condition of the reticle carrier 10. For example, the FDC system 50 may implement SPC charts that document historical data of the reticle carrier 10 by charting SPC data associated with the process over time. Such SPC data includes parameters associated with the location of the reticle carrier 10. When the SPC data indicates that parameters have departed from a range of acceptable values (in other words, when the FDC system 50 detects a fault or abnormality), the FDC system 50 triggers a warning to the control system 60 and/or notifies an engineer or operator of the fabrication system 30, so that any fault with the reticle carrier 10 may be identified and remedied.

The control system 60 can implement control actions in real time, wafer-to-wafer, lot-to-lot, or a combination thereof. In the depicted embodiments, the control system 60 implements control actions to control the operation status of the fabrication system 30. For example, the control system 60 (based on a warning from the FDC system 50) shuts down the operation of the lithography exposure apparatus 31 so as to stop the process being performed in the lithography exposure apparatus 31. In some other embodiments, the control system 60 implements control actions to actuate the transportation apparatus 33 to move the reticle carrier 10 to a maintenance station 90 for maintenance.

In some other embodiments, the control system 60 implements control actions to modify process recipe performed by the lithography exposure apparatus 31. For example, the control system 60 (based on inline metrology data from the metrology tool 40) modifies the predetermined process recipe (specifically, the parameters implemented by the lithography exposure apparatus 31, such as process time, flow rate of gas, chamber pressure, chamber temperature, wafer temperature, or other process parameters) for each reticle to ensure that each reticle located in the lithography exposure apparatus 31 exhibits the targeted characteristics.

The archive database 70 may include a number of storage devices to provide information storage. The information may include raw data obtained directly from the metrology tool 40, as well as information from the fabrication system 30. For example, the information from the metrology tool 40 may be transferred to the archive database 70 and stored in the archive database 70 for archival purposes. The data from the metrology tool 40 may be stored in its original form (e.g., as it was obtained from the metrology tool 40 or the fabrication system 30) and it may be stored in its processed form (e.g., converted to a digital signal from an analog signal). The archive database 70 stores data associated with the fabrication facility 1, and particularly data associated with the environmental conditions in the reticle carrier 10.

In the depicted embodiment, the archive database 70 stores data collected from the fabrication system 30, the metrology tool 40, the FDC system 50, the control system 60, another entity 80, or a combination thereof. For example, the archive database 70 stores data associated with wafer characteristics of wafers processed by the fabrication system 30 (such as that collected by the metrology tool 40 as described below), data associated with parameters implemented by the fabrication system 30 to process such wafers, data associated with analysis of the wafer characteristics and/or parameters of the FDC system 50 and the control system 60, and other data associated with the fabrication facility 1. In one example, the fabrication system 30, the metrology tool 40, the control system 60, the FDC system 50, and the other entity 80 may each have an associated database.

Figure 6:
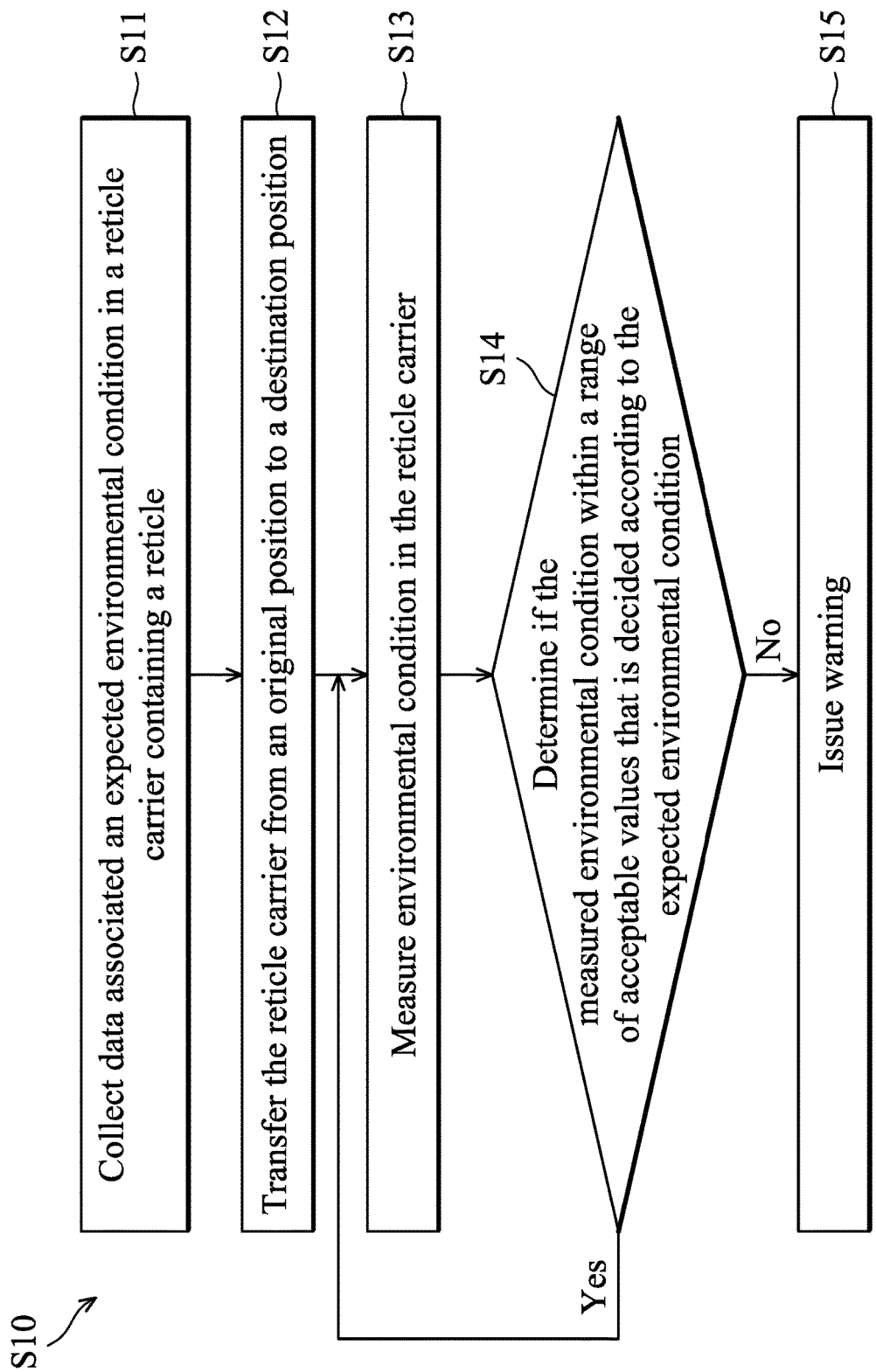
FIG. 6 is a flowchart of a method of enabling fault detection in a reticle carrier, in accordance with some embodiments.

FIG. 6 is a simplified flowchart of a method S10 of enabling fault detection in the reticle carrier 10, in accordance with some embodiments. For illustration, the flow chart will be described along with the drawings shown in FIGS. 1-2 and 5. Some of the described stages can be replaced or eliminated in different embodiments.

The method S10 includes operation S11, in which data associated with the expected environmental conditions in the reticle carrier 10 containing one or more reticles 5 is collected. The data associated with the expected environmental conditions in the reticle carrier 10 may be in the form of a range of values within which it has been observed that normal conditions in the reticle carrier 10 consistently occur. In some embodiments, the data is retrieved from the archive database 70 and sent to the FDC system 50. In some other embodiments, the data is applied to the FDC system 50 by engineering or processing knowledge.

In some embodiments, the data associated with the expected environmental conditions in the reticle carrier 10 in different positions of the fabrication system may be different. For example, the humidity in a position where the load port 322 of the stocker 32 is located may be different from the humidity in the position of the load port 311 of the lithography exposure apparatus 31. Therefore, the data associated with the expected humidity when the reticle carrier 10 is positioned on the load port 322 is different from the data associated with the expected humidity when the reticle carrier 10 is positioned on the load port 311.

In some embodiments, the data associated with the expected environmental conditions in the reticle carrier 10 may vary with time. For example, the environmental conditions in the fabrication facility 1 change regularly. The humidity in the stocker 32 at the beginning of a cycle time is different from the humidity in the stocker 32 in the middle of the cycle time.

The method S10 also includes operation S12, in which the reticle carrier 10 is transferred from an original position to a destination position. In some embodiments, the reticle carrier 10 is moved by the transportation apparatus 33 between the stocker 32 and the lithography exposure apparatus 31. Therefore, either the original position or the destination position is the stocker 32, and the other of either the original position or the destination position is the lithography exposure apparatus 31. In some other embodiments, the reticle carrier 10 is moved between the load port 322 of the stocker 32 and one of the shelves 321 of the stocker 32. In some other embodiments, the reticle carrier 10 is moved between the load port 311 of the lithography exposure apparatus 31 and a position in the lithography exposure apparatus 31 where the reticle 5 may be subjected to exposure light.

The method S10 also includes operation S13, in which environmental conditions in the reticle carrier 10 are measured by the metrology tool 40. In some embodiments, the environmental conditions in the reticle carrier 10 are measured during the transfer of the reticle 5. For example, the measurement of the environmental conditions in the reticle carrier 10 is initiated once the reticle carrier 10 is removed from the shelf 321 in the stocker 32, and the measurement of the environmental conditions in the reticle carrier 10 is terminated once the reticle 5 is removed from the reticle carrier 10 which is placed on the load port 311. In some embodiments, the measurement of the environmental conditions in the reticle carrier 10 is executed while the reticle 5 is stored in the stocker.

In some embodiments, the measurement of the environmental conditions in the reticle carrier 10 is executed periodically when the reticle carrier 10 is coupled to the interface devices 35 in the fabrication system 30. For example, during the movement of the reticle carrier 10 from the shelf 321 to the load port 322 of the stocker 32, the metrology tool 40 will not start monitoring the environmental conditions in the reticle carrier 10 until the reticle carrier 10 is placed on the load port 322. In addition, during the stay of the reticle carrier 10 on the load port 322, the measurement of the environmental conditions in the reticle carrier 10 is executed multiple times at regular time intervals. The detected data associated with the environmental conditions in the reticle carrier 10 is transmitted in real time to the FDC system 50 via the interface devices 35.

However, it should be appreciated that many variations and modifications can be made to embodiments of the disclosure. The measurement of the environmental conditions in the reticle carrier 10 may be executed continuously no matter whether the reticle carrier 10 is engaged with the interface devices 35 or not. The detected data associated with the environmental conditions in the reticle carrier 10 is stored in the storage device 46 of the metrology tool 40 and sent to the FDC system 50 when the reticle carrier 10 is coupled to one of the interface devices 35. Alternatively, the detected data associated with the environmental conditions in the reticle carrier 10 is transmitted to the FDC system 50 in real time through wireless connections.

In some embodiments, the measurement of the environmental conditions in the reticle carrier 10 is executed even during the removal of the reticle 5. For example, once the reticle carrier 10 is placed on the load port 311 of the lithography exposure apparatus 31, the reticle 5 is removed from the reticle carrier 10 by a robot arm (not shown in figures) and moved to an interface module in the lithography exposure apparatus 31. At this time, since the interior (such as the space 110) of the reticle carrier 10 communicates with the interior of the lithography exposure apparatus 31, the metrology tool 40 can be used to detect environmental conditions in the lithography exposure apparatus 31.

The method S10 also includes operation S14, in which the data associated with the measured environmental conditions produced in operation S12 is compared with data associated with the expected environmental conditions collected in operation S11. In some embodiments, the measured environmental conditions obtained in operation S12 is compiled in a time-series chart (T-chart) as shown in FIG. 7, and the T-chart is analyzed by the FDC system 50.

Figure 7:
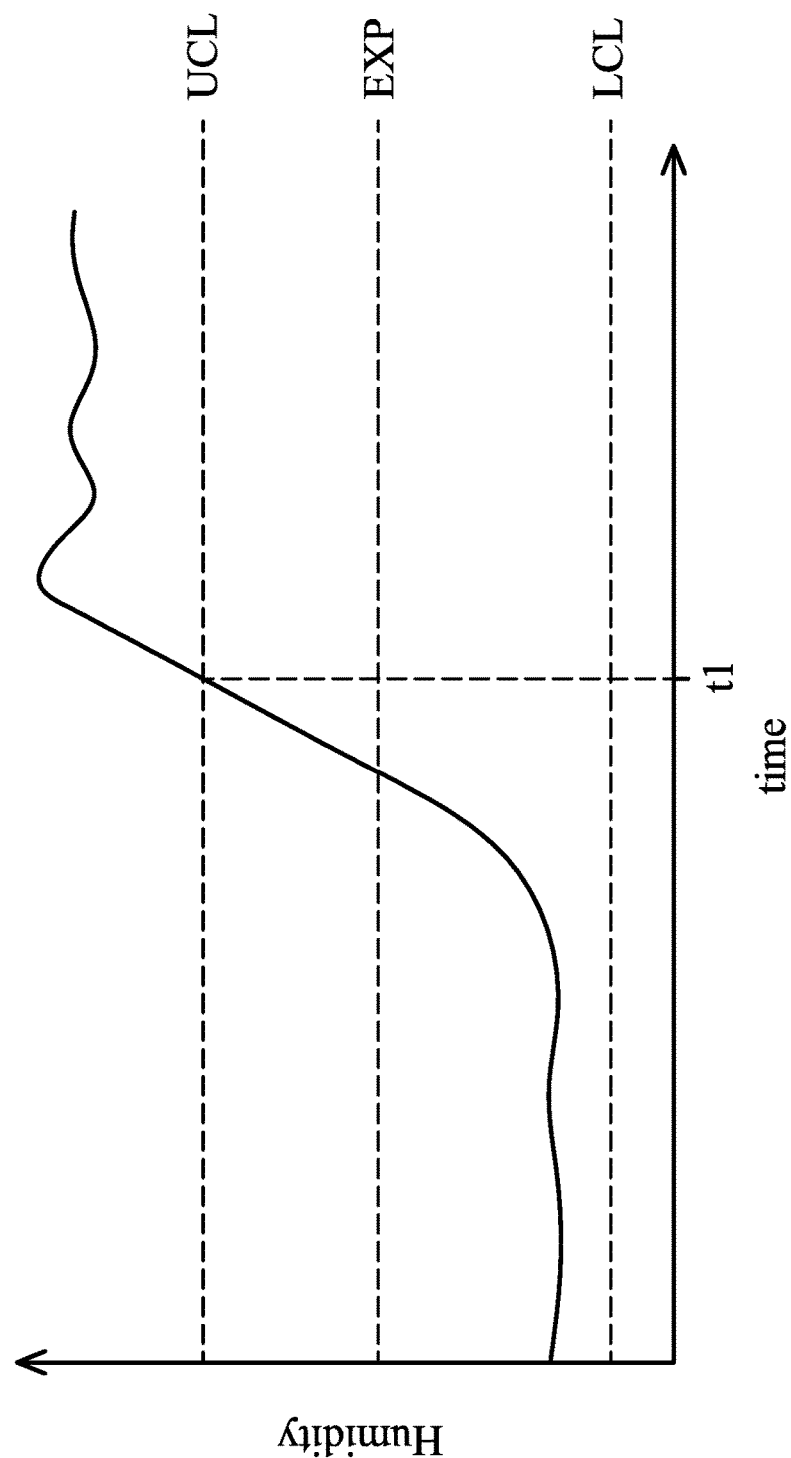
FIG. 7 is a diagram plotting measured humidity in a reticle carrier versus time of storing a reticle in a reticle carrier, upper control limits and lower control limits, in accordance with some embodiments.

In some embodiments, before analyzing the T-chart shown in FIG. 7, a range of acceptable values for the measured environmental conditions is determined. The range of acceptable values for the measured environmental conditions may be a standard deviation from an expected value. For example, as shown in FIG. 7, an upper control limit (UCL) is set at the expected humidity (EXP) plus one standard deviation of the humidity, and lower control limits (LCL) are set at the expected humidity (EXP) minus one standard deviation of the humidity. The difference between the UCL and LCL at a specific time is referred to as the range of acceptable values. In some embodiments, the range of acceptable values is determined by the position where the reticle carrier is located, because the expected environmental conditions vary accordingly.

Alternatively, the range of acceptable values for the measured environmental conditions may be a specific ratio of the expected humidity in each process event. For example, UCL are set at the expected humidity plus about 2% of the humidity, and LCL are set at the expected humidity minus about 2% of the humidity. The difference between the UCL and LCL at a specific time is referred to as the range of acceptable values.

After the range of acceptable values for the measured environmental conditions is determined, the FDC system 50 analyzes the measured environmental conditions to determine if the measured environmental conditions are within the acceptable range.

After the analysis, if the measured environmental conditions are within the range of acceptable values, the method repeats operation S13 and S14 until the predetermined period for monitoring the reticle carrier 10 is finished, for example, until the operation S12 is finished. However, if the measured environmental conditions exceed the range of acceptable values, the method continues with operation S15, in which an alarm condition is indicated. For example, as shown in FIG. 7, at time t1, the measured humidity is higher than the UCL. Namely, the measured humidity is outside the range of acceptable values, and a warning is issued at time t1.

In some embodiments, when the data processed by the FDC system 50 indicates that the measured humidity has departed from the expected humidity (in other words, when the FDC system 50 detects a fault or abnormality), the FDC system 50 triggers an alarm. In some embodiments, out-of-specification data indicates a fault (or abnormality) in the reticle carrier 10, such as exposure of the reticle to the outside of the reticle carrier 10 or an electrostatic accumulation in the reticle carrier 10.

Since the exposure of the reticle to the outside of the reticle carrier 10 or electrostatic accumulation may decrease the yield of the lithography exposure process, the FDC system 50 triggers an alarm and notifies the control system 60 to move the reticle carrier 10 along with the reticle 5 to a maintenance station 90 (FIG. 2) for maintenance, so that any issues with the reticle carrier 10 or the reticle 5 may be identified and remedied to prevent excessive scrap wafer from being produced in the lithography exposure apparatus 31.

When the reticle 5 undergoes maintenance, any suitable process may be performed on the reticle 5 so as to make the reticle 5 suitable for use in the lithography exposure apparatus 31 again. For example, the reticle 5 may be cleaned to remove particles. Alternatively, the reticle 5 may be placed on a conductive stage so that any accumulated electrostatic charge may be neutralized. After the maintenance is complete, the reticle 5 may be placed into another new reticle carrier 10 or placed into the original reticle carrier 10. Afterwards, the reticle carrier 10 and the reticle 5 are moved to the lithography exposure apparatus 31 for processing, or to the stocker 32 for storage. During the movement of a reticle 5 which has been cleaned, the environmental conditions in the reticle carrier 10 are also detected using the method S10 described above.

Figure 8:
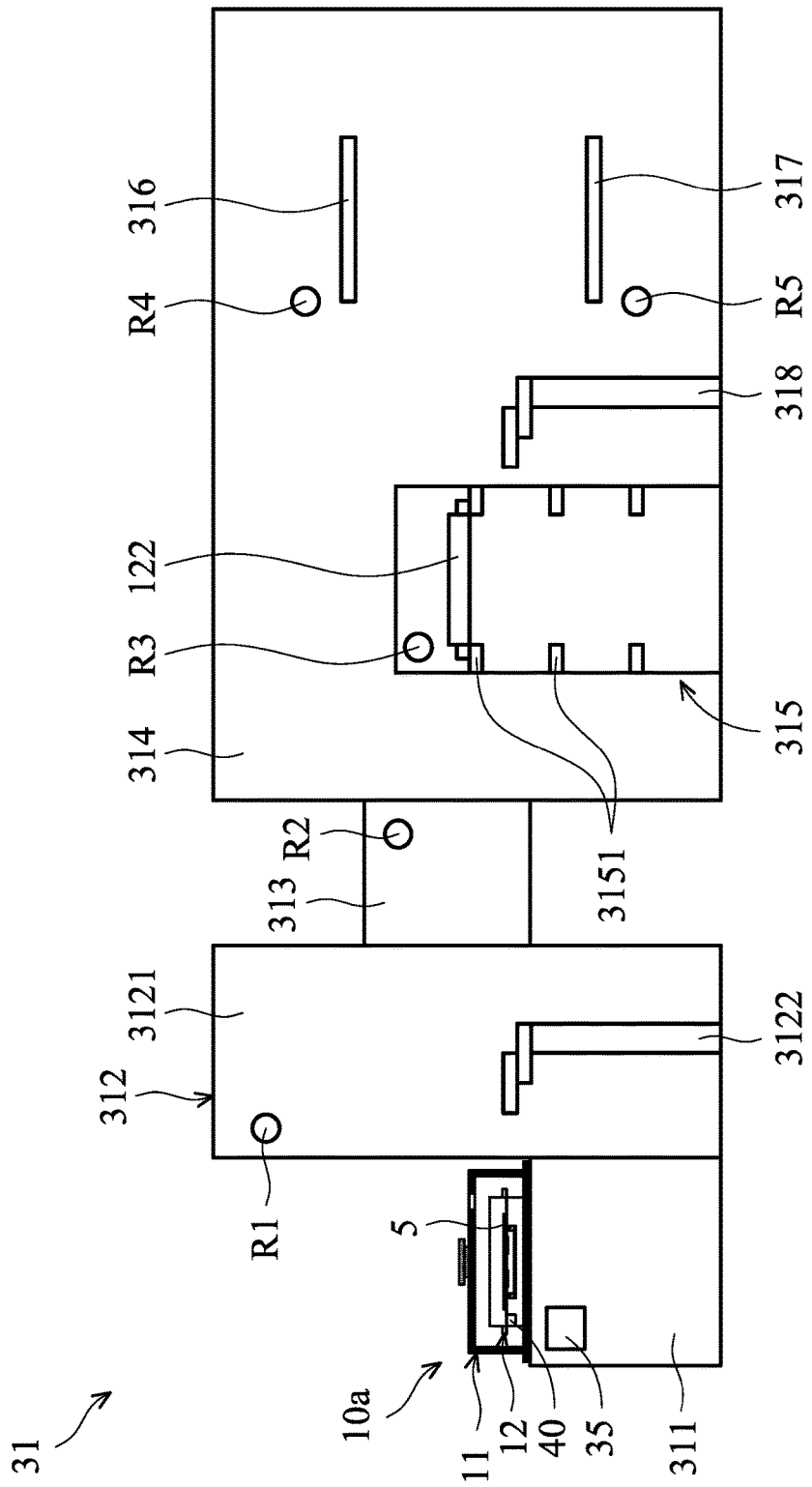
FIG. 8 is a schematic view of a lithography exposure apparatus, in accordance with some embodiments.

FIG. 8 is a schematic and diagrammatic view of a lithography exposure apparatus 31, in accordance with some embodiments. In some embodiments, the lithography exposure apparatus 31 includes the load port 311, an interface module 312, a load lock chamber 313, a vacuum vessel 314, a cover handling chamber 315, a reticle chuck 316, a reticle exchanging station 317, and a transfer mechanism 318. It should be appreciated that the features described below can be replaced or eliminated in other embodiments of the lithography exposure apparatus 31.

The interface module 312 is configured to handle the inner pod 12 from the outer pod 11. The interface module 312 includes a housing 3121, and one or more transferring means such as a robotic arm 3122, in accordance with some embodiments. In some embodiments, the interface module 312 includes an equipment front end module (EFEM). The robotic arm 3122 is disposed within the housing 3121. The robotic arm 3122 is configured for physically transporting the inner pod 12. For example, the robotic arm 3122 may retrieve the inner pod 12 from the outer pod 11 to the housing 3121, or the robotic arm 3122 may transport the inner pod 12 to and from the load lock chamber 313. However, the locations where the robotic arm 3122 may transport the inner pod 12 are not limited by the present embodiment.

The load lock chamber 313 is located between the interface module 312 and the vacuum vessel 314. The load lock chamber 313 is configured for preserving the atmosphere within the vacuum vessel 314 by separating it from the interface module 312. The load lock chamber 313 is capable of creating an atmosphere compatible with the vacuum vessel 314 or the interface module 312, depending on where the loaded inner pod 12 is scheduled to be next. This can be performed by altering the gas content of the load lock chamber 313 by such means as adding gas or creating a vacuum, along with other suitable means for adjusting the atmosphere in the load lock chamber 313.

The vacuum vessel 314 preserves a vacuum environment at an ultra-high vacuum pressure. The cover handling chamber 315, the reticle exchanging station 317 and the reticle chuck 316 are positioned in the vacuum vessel 314. The cover handling chamber 315 is configured for storing one or more covers 122 removed from the inner pod 12. In some embodiments, the cover handling chamber 315 includes a number of holding members 3151 for supporting the covers 122 removed from the inner pod 12. The reticle chuck 316 is configured for securing the reticle 5 during the lithography exposure process. In some embodiments, the reticle chuck 316 includes an E-chuck which creates a clamping force by generating an electrostatic field.

The reticle exchanging station 317 is configured to support the baseplate 124 of the inner pod 12 before the reticle 5 is secured by the reticle chuck 316 or after the baseplate 124 is released from the reticle chuck 316. In some embodiments, the reticle exchanging station 317 is positioned relative to the reticle chuck 316. In some other embodiments, the reticle exchanging station 317 is able to be moved by a driving member, such as linear motor (not shown in figures). To place the reticle 5 on a preset position of the reticle chuck 316, an alignment tool (such as a camera, not shown in figures) produces information about the position of the reticle exchanging station 317 and/or the reticle chuck 316, and the reticle exchanging station 317 is moved by using the information from the alignment tool to perform an alignment process on the reticle exchanging station 317 relative to the reticle chuck 316.

The transfer mechanism 318 is configured to transfer the inner pod 12 or the baseplate 124 of the inner pod 12 (FIG. 4) within the vacuum vessel 314. The transfer mechanism 318 may be elevated, moved leftward and rightward, moved forward and backward, and rotated around the vertical axis so as to transfer the inner pod 12 or the baseplate 124 of the inner pod 12 among the load lock chamber 313, the cover handling chamber 315, and the reticle exchanging station 317.

In some embodiments, there are a number of signal receivers positioned in the lithography exposure apparatus 31. For example, the signal receivers R1, R2, R3, R4 and R5 are respectively positioned in the housing 3121, in the load lock chamber 313, in the cover handling chamber 315, adjacent to the reticle chuck 316, and adjacent to the reticle exchanging station 317. The signal receivers R1, R2, R3, R4 and R5 are configured to receive data signals transmitted from the metrology tool 40 in the inner pod 12 when the inner pod 12 is moved to a nearby position via a wireless connection.

Figure 9:
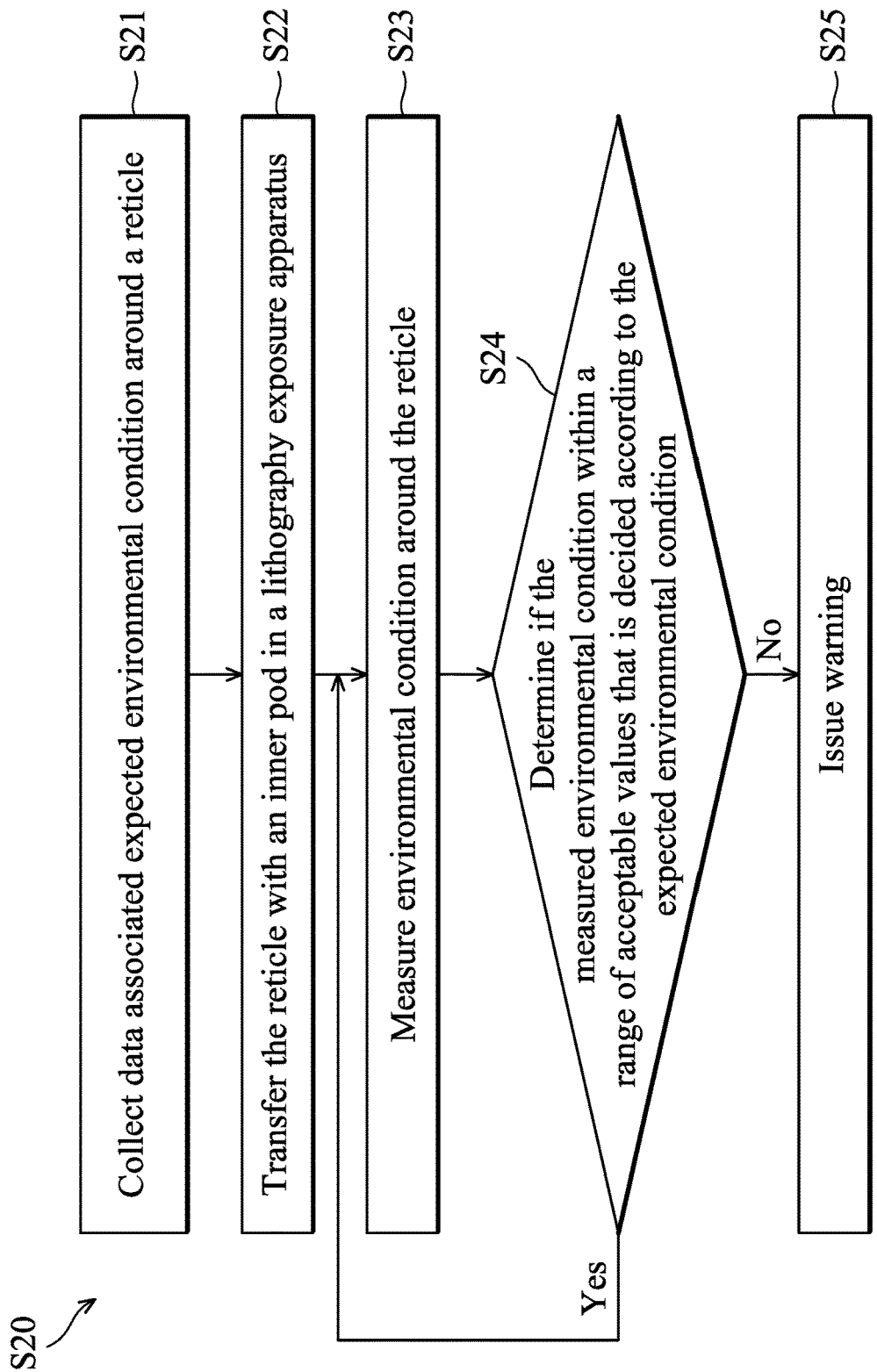
FIG. 9 is a flowchart of a method of enabling fault detection in a reticle carrier, in accordance with some embodiments.
Figure 10:
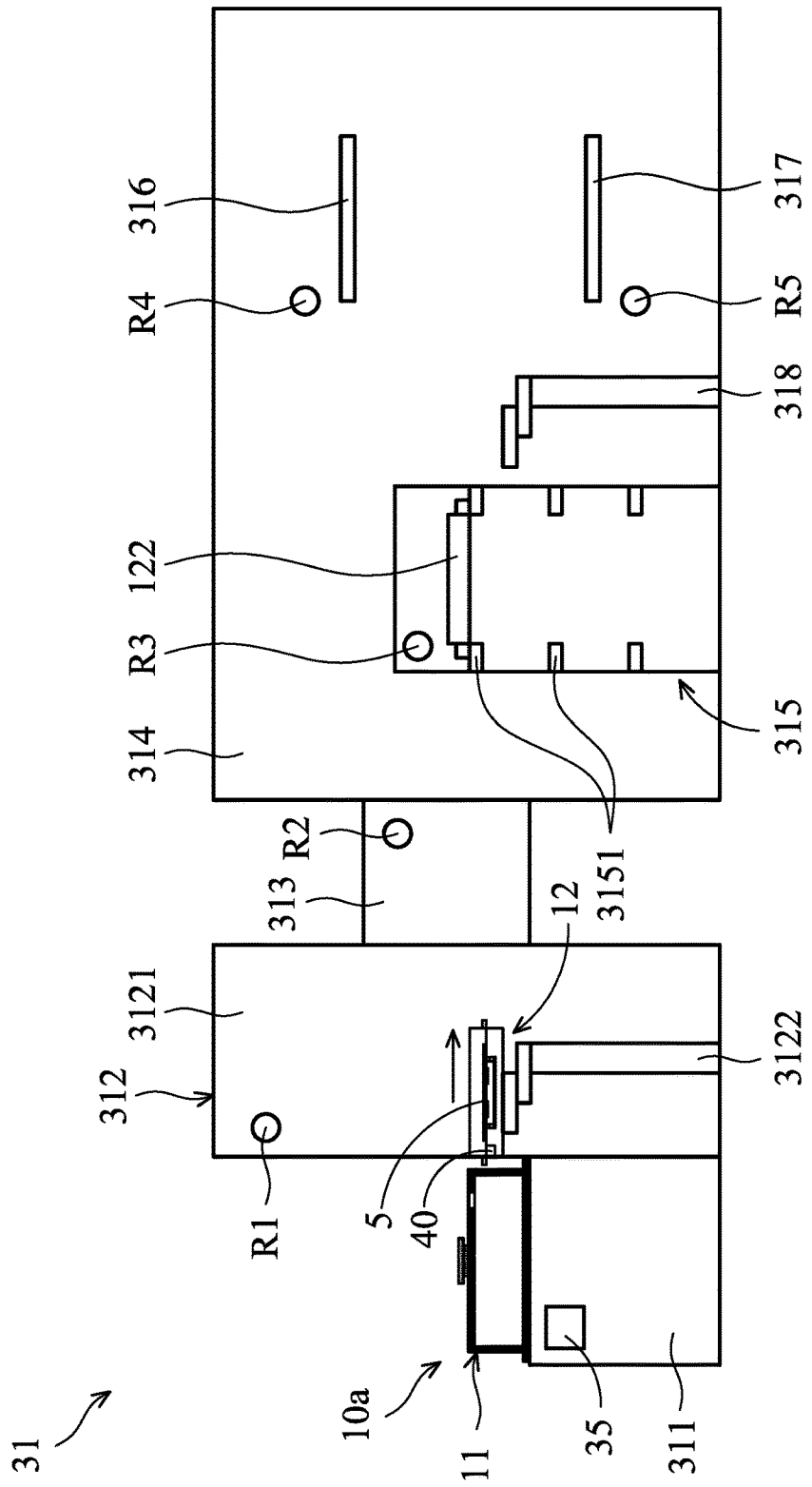
FIG. 10 shows a schematic view of one stage of a method for transporting a reticle in a lithography exposure apparatus as the reticle is positioned over a load port, in accordance with some embodiments.

FIG. 9 is a simplified flowchart of a method S20 of enabling fault detection in the reticle carrier 10a, in accordance with some embodiments. For illustration, the flow chart will be described along with the drawings shown in FIGS. 8 and 10-14. Some of the described stages can be replaced or eliminated in different embodiments.

The method S20 includes operation S21, in which data associated with the expected environmental conditions around the reticle 5 during the transfer in the lithography exposure apparatus 31 is collected. The data associated with the expected environmental conditions around the reticle 5 may be in the form of a range of values within which it has been observed that normal conditions around the reticle 5 consistently occur. In some embodiments, the data is retrieved from the archive database 70 and sent to the FDC system 50. In some other embodiments, the data is applied to the FDC system 50 by engineering or processing knowledge.

In some embodiments, the data associated with the expected environmental conditions around the reticle 5 in different positions of the lithography exposure apparatus 31 may be different. For example, the pressure in the housing 3121 is different from the pressure in the vacuum vessel 314. Therefore, the data associated with the expected pressure when the reticle 5 is located in the housing 3121 is different from the data associated with the expected pressure when the reticle 5 is located in the vacuum vessel 314.

The method S20 includes operation S22, in which the inner pod 12 of the reticle carrier 10a which contains a reticle 5 is moved in the lithography exposure apparatus 31. In some embodiments, to perform a lithography exposure process on the reticle 5, the reticle carrier 10a which contains the reticle 5 in the inner pod 12 is placed on the load port 311 of the lithography exposure apparatus 31, as shown in FIG. 8. After the reticle carrier 10a is placed on the load port 311, the inner pod 12 is removed from the outer pod 11 by the robotic arm 3122 and moved toward the load lock chamber 313, in the direction indicated by the arrow in FIG. 10.

Figure 11:
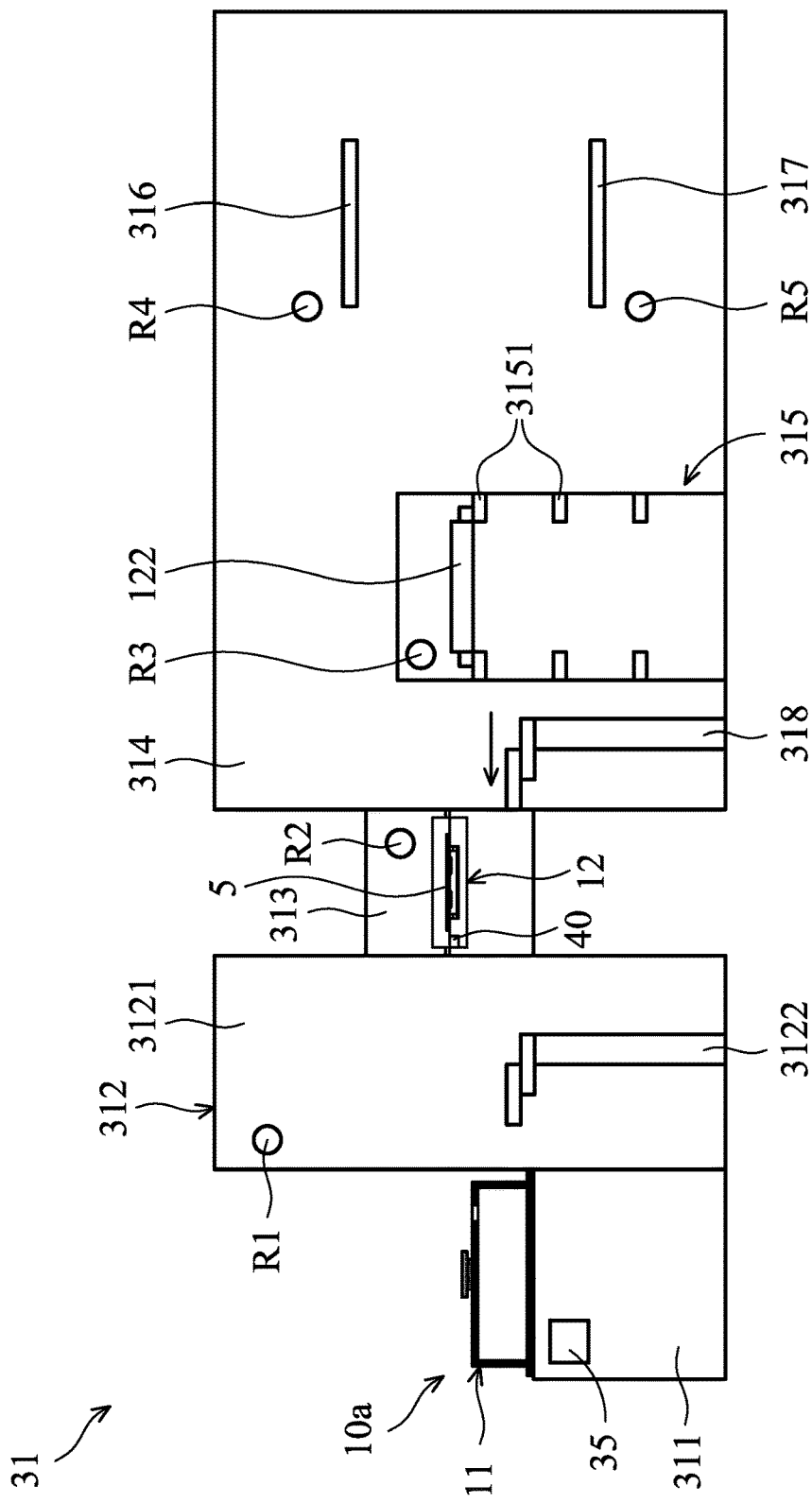
FIG. 11 shows a schematic view of one stage of a method for transporting a reticle in a lithography exposure apparatus as the reticle is positioned in a load lock chamber, in accordance with some embodiments.

When the inner pod 12 is placed in the load lock chamber 313, the robotic arm 3122 returns to the housing 3121, as shown in FIG. 11. At this time, the load lock chamber 313 is sealed and an atmosphere compatible with the vacuum pressure in the vacuum vessel 314 is created by altering the gas content of the load lock chamber 313 by such means as adding gas or creating a vacuum, along with other suitable means for adjusting the atmosphere in the load lock chamber 313. When the correct atmosphere has been reached, the transfer mechanism 318 removes the inner pod 12 from the load lock chamber 313. As a result, the inner pod 12, along with the reticle 5, is moved from an ambient environment (i.e., space in the outer pod 11 and the housing 3121) to a vacuum environment (i.e. space in the vacuum vessel 314).

Figure 12:
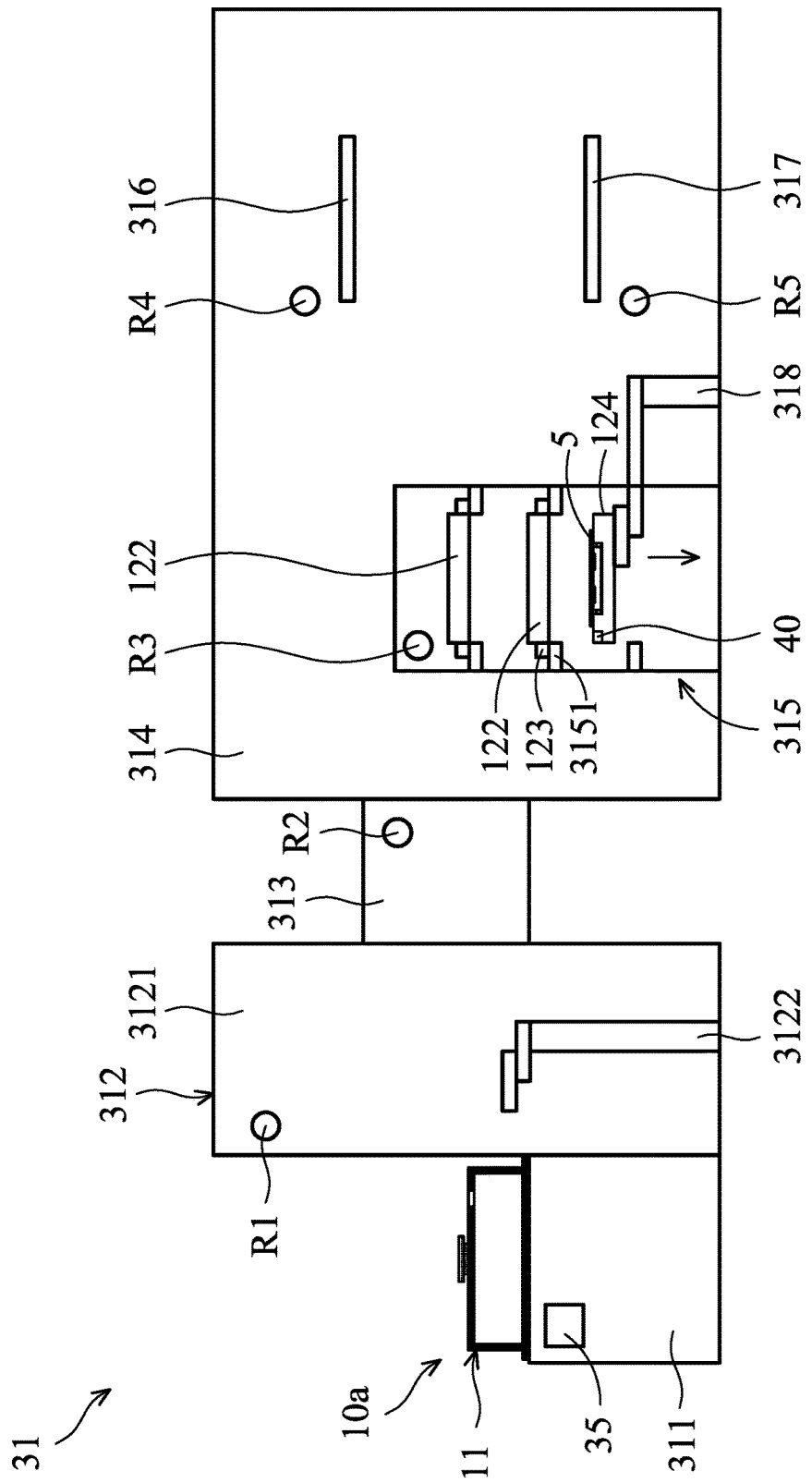
FIG. 12 shows a schematic view of one stage of a method for transporting a reticle in a lithography exposure apparatus as the reticle is positioned over a cover handling chamber, in accordance with some embodiments.

In some embodiments, after the inner pod 12 is moved into the vacuum environment, the inner pod 12 is transferred to the cover handling chamber 315 by the transfer mechanism 318, as shown in FIG. 12. In the cover handling chamber 315, the flanges 123 of the cover 122 are supported by the holding members 3151, and the cover 122 is left on the holding member 3151 by moving the baseplate 124 in the direction indicated by the arrow in FIG. 12. As a result, the cover 122 is removed from the baseplate 124. At this time, the reticle 5 is placed on the baseplate 124, and the metrology tool 40b on the baseplate 124 is exposed to the vacuum environment.

Figure 13:
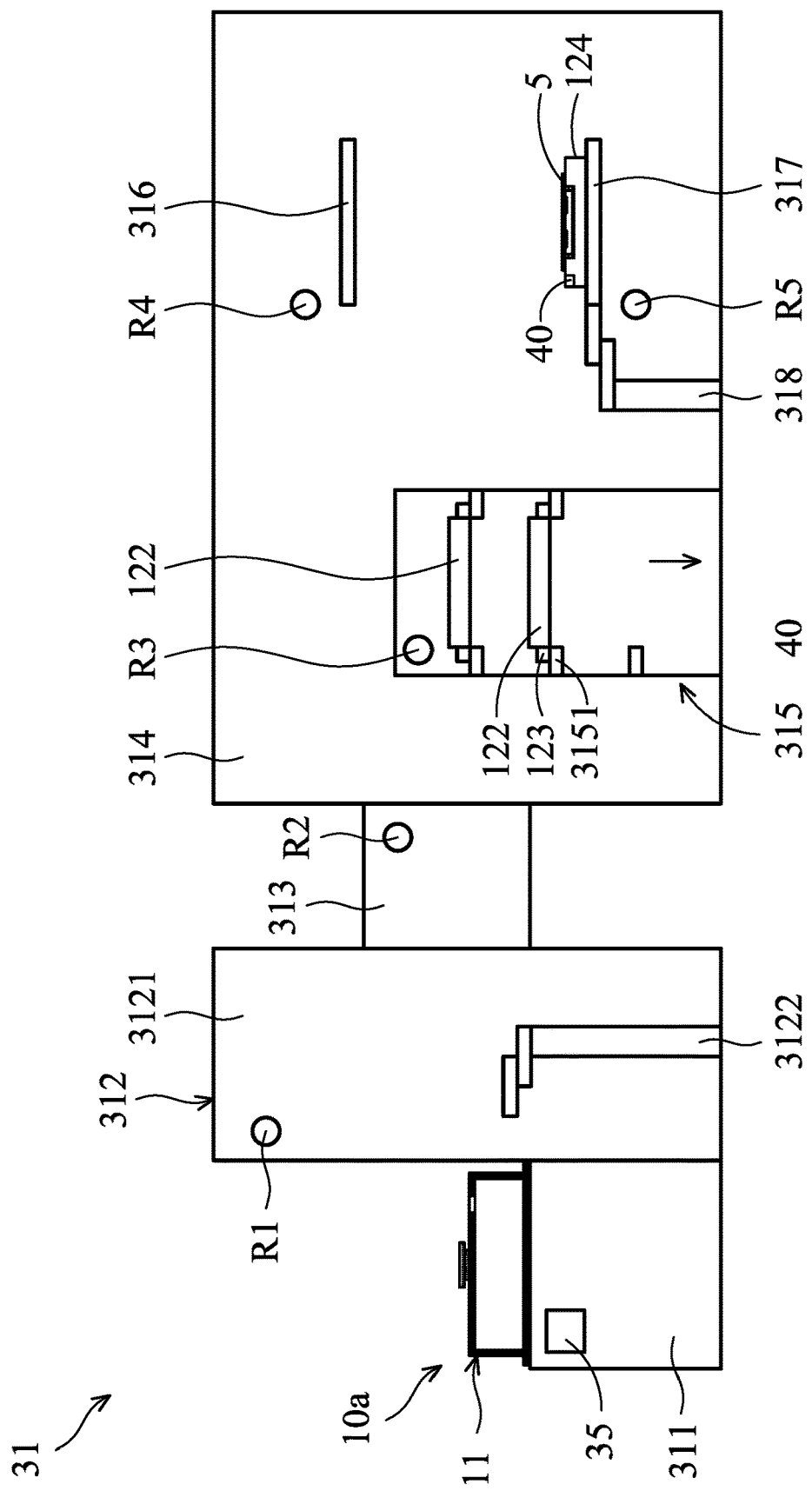
FIG. 13 shows a schematic view of one stage of a method for transporting a reticle in a lithography exposure apparatus as the reticle is positioned over a reticle exchanging station, in accordance with some embodiments.
Figure 14:
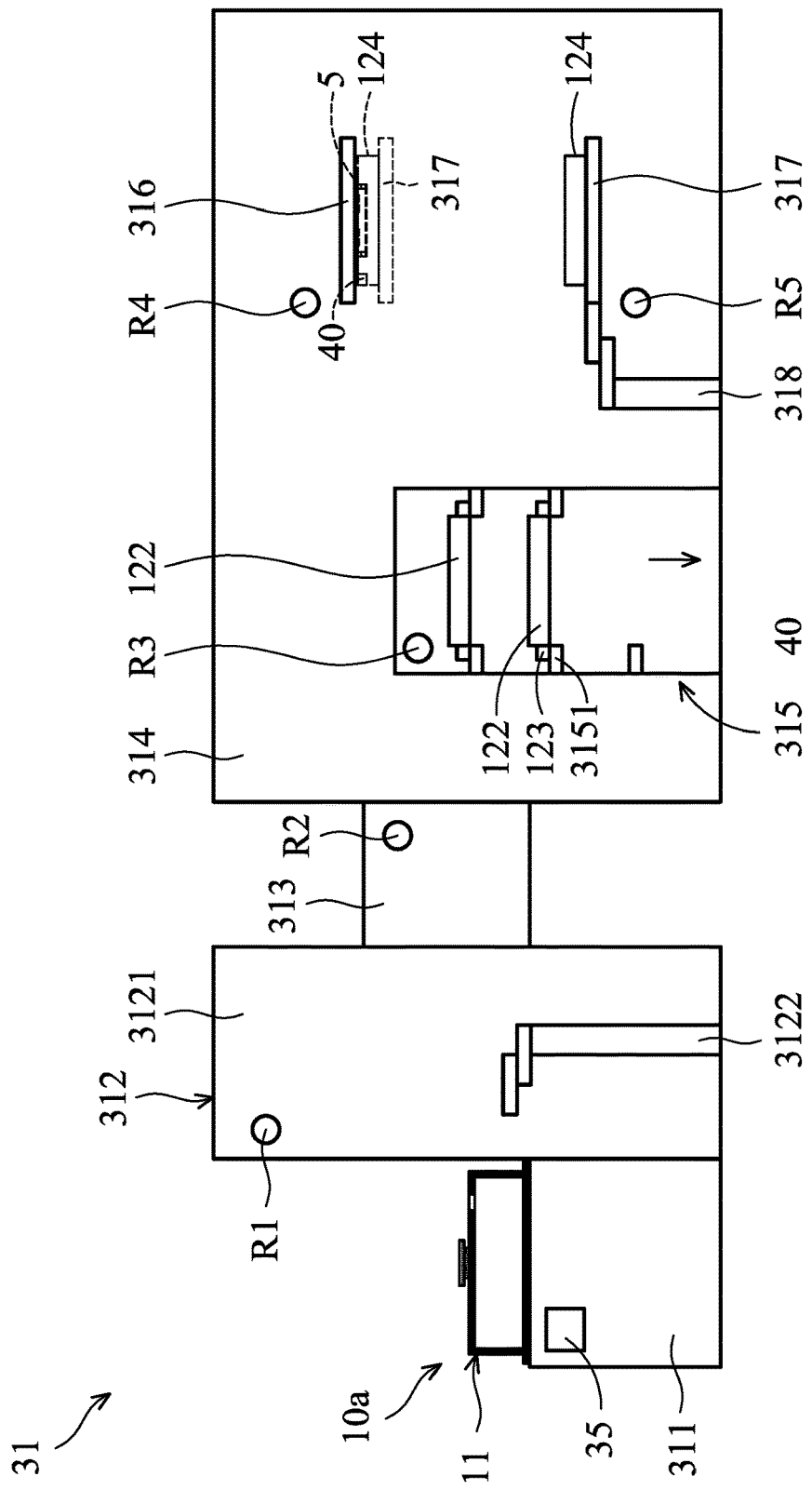
FIG. 14 shows a schematic view of one stage of a method for transporting a reticle in a lithography exposure apparatus as the reticle is positioned over a reticle chuck, in accordance with some embodiments.

In some embodiments, after the cover 122 is removed from the baseplate 124, the baseplate 124 and reticle 5 are placed on the reticle exchanging station 317 by the transfer mechanism 318, as shown in FIG. 13. Afterwards, the reticle exchanging station 317 is elevated to a loading position as indicated by the dotted lines in FIG. 14 to create a direct contact between the reticle 5 and the reticle chuck 316. As a result, the reticle 5 is secured by the reticle chuck 316 with the clamping force generated by the reticle chuck 316 and is ready for the lithography exposure process, such as being subjected to an extreme ultraviolet (EUV) light. After the reticle 5 is secured by the reticle chuck 316, the vacant baseplate 124 is lowered down to its original position as indicated by solid lines in FIG. 14.

The method S20 also includes operation S23, in which the environmental conditions around the reticle 5 are measured by the metrology tool 40. In some embodiments, the environmental conditions around the reticle 5 are measured using the metrology tool 40 when the inner pod 12 is closed. For example, the measurement of the environmental conditions around the reticle 5 is initiated when the inner pod 12 is removed from the outer pod 11 and is terminated when the cover 122 is removed from the baseplate 124. In this case, since the environmental conditions in the inner pod 12 are measured, the health of the reticle 5 can be monitored.

In some embodiments, the environmental conditions around the reticle 5 are measured using the metrology tool 40 when the inner pod 12 is open. For example, the measurement of the environmental conditions around the reticle 5 is initiated when the cover 122 is removed from the baseplate 124 and is terminated when the reticle 5 is removed from the baseplate 124 by the reticle chuck 316. In this case, since the environmental conditions in the vacuum vessel 314, especially the space around the baseplate 124 and the reticle 5, are measured, the health of the lithography exposure apparatus 31 can be monitored.

In some embodiments, the environmental conditions around the reticle 5 are measured using the metrology tool 40 no matter whether the inner pod 12 is closed or open. Therefore, both the health of the reticle 5 and the health of the lithography exposure apparatus 31 can be monitored.

In some embodiments, in addition to the period when the reticle 5 is positioned in the inner pod 12, the metrology tool 40 continuously detects the environmental conditions after the removal of the reticle 5. For example, after the reticle 5 is secured by the reticle chuck 316, the metrology tool 40 on the baseplate 124 is used to detect the environmental conditions in the vacuum vessel 314, especially in the space around the baseplate 124.

In some embodiments, the data associated with the environmental conditions around the reticle 5 or the baseplate 124 is produced by the metrology tool 40 according to the detected result. Afterwards, the data may be sent to one of the nearby signal receivers R1, R2, R3, R4 and R5 through wireless connections, and the data received by the signal receivers R1, R2, R3, R4 and R5 are is transmitted to the FDC system 50 for data analysis. Alternatively, the data is stored in the storage device 46 of the metrology tool 40 and is transmitted to the FDC system 50 when the metrology tool 40 is coupled to the interface device 35.

The method S20 also includes operation S24, in which the data associated with the measured environmental conditions produced in operation S23 is compared with data associated with the expected environmental conditions collected in operation S21. The operation S24 is similar to operation S14 of FIG. 6 and will not be described again for brevity.

After operation S24, if the measured environmental conditions are within the range of acceptable value, the method repeats operations S23 and S24 until a predetermined period for monitoring environmental conditions around the reticle carrier 10a is finished, for example, until the reticle 5 is secured by the reticle chuck 316. However, if the measured environmental conditions exceed the range of acceptable values, the method continues with operation S25, in which an alarm condition is indicated.

In some embodiments, when the data processed by the FDC system 50 indicates that the measured environmental conditions have departed from the expected environmental conditions (in other words, when the FDC system 50 detects a fault or abnormality), the FDC system 50 triggers an alarm. In some embodiments, out-of-specification data indicates a fault (or abnormality) around the reticle 5, such as an exposure of the reticle to the outside of the inner pod 12 or an electrostatic accumulation in the reticle 5.

In this case, the FDC system 50 triggers an alarm and notifies the control system 60 to move the inner pod 12 along with the reticle 5 being loaded into the outer pod 11. Afterwards, the reticle carrier 10a along with the reticle 5 are moved to a maintenance station 90 (FIG. 2) for maintenance, so that any issues with the reticle carrier 10a or the reticle 5 may be identified and remedied and to prevent excessive scrap wafer from being produced in the lithography exposure apparatus 31.

In some embodiments, out-of-specification data indicates a fault (or abnormality) of the lithography exposure apparatus 31, such as the wrong vacuum pressure in the vacuum vessel 314. In this case, to prevent the lithography exposure apparatus 31 from being damaged, the FDC system 60 triggers an alarm and notifies the operator of the lithography exposure apparatus 31 to halt the process being performed by the lithography exposure apparatus 31, to take another action, or a combination thereof, so that any issues with the lithography exposure apparatus 31 may be identified and remedied to prevent excessive scrap wafer from being produced in the lithography exposure apparatus 31.

In some embodiments, out-of-specification data indicates a fault (or abnormality) of the baseplate 124. In this case, in order to prevent the reticle 5 from being released from the reticle chuck 316 and contaminated, the reticle 5 will not be placed back into the baseplate 124 if the detected environmental conditions in the baseplate 124 are not acceptable, and another baseplate 124 with acceptable environmental conditions is used to carry the released reticle 5.

Embodiments of method and device for fault detection in a fabrication facility are provided. Data associated with the environmental conditions in the reticle carrier are detected and analyzed to determine whether an abnormal condition is generated in the reticle carrier. When an abnormal situation occurs, the control system will undertake an immediate response and handle it properly. Therefore, conditions that degrade the result of photolithography process due to an abnormality of the reticle can be prevented, and the production yield of the semiconductor wafers which are being patterned by the reticle is greatly improved.

In accordance with some embodiments, a method for fault detection in a fabrication system is provided. The method includes transferring a reticle carrier containing a reticle from an original position to a destination position. The method further includes detecting environmental condition in the reticle carrier during the transfer of the reticle carrier using a metrology tool that is positioned at the reticle carrier. The method also includes issuing a warning when the detected environmental condition is outside a range of acceptable values.

In accordance with some embodiments, a method for fault detection in a fabrication system is provided. The method includes transferring an inner pod of a reticle carrier which contains a reticle in a lithography exposure apparatus. The method further includes detecting environmental condition around the reticle using a metrology tool positioned in the inner pod. The process for detection is performed during the transfer of the inner pod in the lithography exposure apparatus. The method also includes issuing a warning when the environmental condition is outside of a range of acceptable value.

In accordance with some embodiments, a fabrication facility is provided. The fabrication facility includes a reticle carrier configured to receive a reticle for a lithography exposure process. The fabrication facility further includes a first metrology tool positioned in the reticle carrier. The first metrology tool is configured to detect environmental condition in the reticle carrier. The fabrication facility also includes a transferring apparatus configured to transfer the reticle carrier. In addition, the fabrication facility includes a control system configured to control an operation of the transferring apparatus to move the reticle carrier for maintenance when the environmental condition detected by the first metrology tool is outside a range of acceptable values.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for fault detection in a fabrication system, comprising:
   transferring a reticle carrier by a transferring apparatus from an original position to a destination position, wherein the reticle carrier contains a reticle;
   detecting environmental condition in the reticle carrier during the transfer of the reticle carrier using a metrology tool that is positioned at the reticle carrier;
   issuing a warning when the detected environmental condition is outside a range of acceptable values; and
   providing charging power to the reticle carrier by an interface device that is positioned at the transferring apparatus.

2. The method as claimed in claim 1, wherein either the original position or the destination position comprises a stocker for storing a plurality of reticle carriers, and the other of either the original position or the destination position comprises a lithography exposure apparatus for performing a lithography exposure process.

3. The method as claimed in claim 2, further comprising storing the reticle carrier in the stocker for a predetermined time period, wherein the environmental condition in the reticle carrier is monitored while the reticle carrier is stored in the stocker.

4. The method as claimed in claim 1, wherein the range of acceptable values is determined according to a position where the reticle carrier is located.

5. The method as claimed in claim 1, further comprises:
   transmitting a data associated with the environmental condition to a fault detection and classification system via the interface device.

6. A method for fault detection in a fabrication system, comprising:
   transferring an inner pod of a reticle carrier out from an outer pod of the reticle carrier, wherein the inner pod contains a reticle in a lithography exposure apparatus;
   detecting environmental condition around the reticle using a first metrology tool positioned in the inner pod and a second metrology tool positioned in the outer pod but outside the inner pod during the transfer of the inner pod in the lithography exposure apparatus; and
   issuing a warning when the environmental condition detected by one of the first metrology tool and the second metrology tool is outside of a range of acceptable value.

7. The method as claimed in claim 6, further comprising:
   removing the reticle from the inner pod using a reticle chuck in the lithography exposure apparatus;
   detecting the environmental condition around the inner pod using the first metrology tool or the second metrology tool after the removal of the reticle.

8. The method as claimed in claim 6, further comprising transmitting a data associated with the environmental condition to a fault detection and classification system via a signal receiver that is positioned in the lithography exposure apparatus.

9. The method as claimed in claim 6, further comprising removing a cover of the inner pod to expose the reticle in a vacuum environment, wherein the first metrology tool or the second metrology tool detects the environmental condition in the vacuum environment.

10. The method as claimed in claim 6, wherein the range of acceptable values is determined by a position where the first metrology tool or the second metrology tool is located.

11. A fabrication facility, comprising:
    a reticle carrier configured to receive a reticle for a lithography exposure process, wherein the reticle carrier comprises:
    an inner pod configured to receiving the reticle, wherein the first metrology tool is positioned in the inner pod; and
    an outer pod configured to receiving the inner pod;
    a first metrology tool positioned in the reticle carrier and configured to detect environmental condition in the reticle carrier;

a second metrology tool positioned in the outer pod but outside the inner pod, wherein the second metrology tool is configured for detecting the environmental condition in the outer pod;

a transferring apparatus configured to transfer the reticle carrier; and a control system configured to control the transferring apparatus to move the reticle carrier for maintenance when the environmental condition detected by one of the first metrology tool and the second metrology tool is outside a range of acceptable values.

12. The fabrication facility as claimed in claim 11, wherein the environmental condition detected in the reticle carrier comprises a level of gas concentration, temperature, humidity, and electrostatic value.

13. The fabrication facility as claimed in claim 11, further comprising an interface device positioned in the transferring apparatus, wherein the interface device is configured to transmit a data from the first metrology tool that is produced according to the detected environmental condition.

14. The fabrication facility as claimed in claim 11, further comprising an interface device positioned in the transferring apparatus, wherein the interface device is configured to supply power to the first metrology tool.

15. The method as claimed in claim 1, wherein the range of acceptable values is determined according to time variation.

16. The method as claimed in claim 1, wherein the range of acceptable values is determined according to a standard deviation from an expected value.

17. The method as claimed in claim 6, further comprises moving the inner pod along with the reticle being loaded into the outer pod after the warning is issued.

18. The fabrication facility as claimed in claim 11, wherein the inner pod comprises a cover and a baseplate, and the cover has a pair of flanges formed on two opposite side walls.

19. The method as claimed in claim 6, wherein the range of acceptable values is determined according to time variation or a standard deviation from an expected value.

20. The method as claimed in claim 6, wherein the inner pod of the reticle carrier is transferred by a transferring apparatus, and the method further comprises providing charging power to the reticle carrier by an interface device that is positioned at the transferring apparatus.

* * * * *